(12) United States Patent
Dalal et al.

(10) Patent No.: US 10,170,981 B1
(45) Date of Patent: Jan. 1, 2019

(54) CONFIGURABLE BI-DIRECTIONAL CHARGE PUMP DESIGN

(71) Applicants: Robert Bosch GmbH, Stuttgart (DE); Akustica, Inc., Pittsburgh, PA (US)

(72) Inventors: Milap J. Dalal, Pittsburgh, PA (US); Matthew A. Zeleznik, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/873,740

(22) Filed: Jan. 17, 2018

Related U.S. Application Data (60) Provisional application No. 62/537,233, filed on Jul. 26, 2017.

(51) Int. Cl.
| | |
|---|---|
| *G05F 3/02* | (2006.01) |
| *G05F 1/10* | (2006.01) |
| *H02M 3/07* | (2006.01) |
| *H01L 27/092* | (2006.01) |
| *H04R 3/00* | (2006.01) |
| *H04R 19/04* | (2006.01) |

(52) U.S. Cl.
CPC ........ *H02M 3/073* (2013.01); *H01L 27/0928* (2013.01); *H02M 2003/071* (2013.01); *H04R 3/00* (2013.01); *H04R 19/04* (2013.01); *H04R 2201/003* (2013.01)

(58) Field of Classification Search
CPC .. H02M 3/073; H02M 3/07; H02M 2003/077; G11C 5/145; G05F 3/205
USPC .......................................................... 327/536
See application file for complete search history.

(56) References Cited

U.S. PATENT DOCUMENTS

| | | | |
|---|---|---|---|
| 6,107,864 A * | 8/2000 | Fukushima | ........... H02M 3/073 327/536 |
| 2001/0005159 A1* | 6/2001 | Matsumoto | ......... H01L 27/0629 327/536 |
| 2012/0242400 A1* | 9/2012 | Shaeffer | ............ H01L 21/82389 327/536 |

* cited by examiner

*Primary Examiner* — Quan Tra
(74) *Attorney, Agent, or Firm* — Maginot Moore & Beck LLP (57) ABSTRACT

A bi-directional charge pump cell includes a p-type substrate having a main surface. A first n-well is formed in the p-type substrate that includes n+ doped regions formed in the first n− well at the main surface. A first p-well is formed in the first n− well that includes p+ doped regions formed in the first p-well at the main surface. A second n-well is formed in the first p-well that includes n+ doped regions and PMOS transistors formed at the main surface. A second p-well is formed in the first n-well that includes p+ doped regions at the main surface. A third p-well is defined in the second p-well that includes p+ doped regions and NMOS transistors at the main surface.

13 Claims, 12 Drawing Sheets

CONFIGURABLE BI-DIRECTIONAL CHARGE PUMP DESIGN

CROSS-REFERENCE TO RELATED APPLICATIONS

This application claims priority to U.S. Provisional Application Ser. No. 62/537,233 entitled "A CONFIGURABLE BI-DIRECTIONAL CHARGE PUMP DESIGN" by Dalal et al., filed Jul. 26, 2017, the disclosure of which is hereby incorporated herein by reference in its entirety.

TECHNICAL FIELD

The device and method disclosed in this document relates to charge pumps and, more particularly, to a configurable bi-directional charge pump.

BACKGROUND

The design of electrically-differential MEMS microphones requires minimal (ideally zero) variation in the DC output magnitudes of the positive and negative charge pumps (CPs) to ensure that the acoustic signals generated by each microphone are truly differential. Although careful design can keep this difference low, dissimilarities in layout can produce leakage paths or other loss mechanisms in each pump that can increase the separation between the efficiency of the positive and negative CPs, which in turn make the voltage difference between both pumps worse. These factors are amplified as the charge pumps are evaluated across process, frequency, etc.

Figure 1:
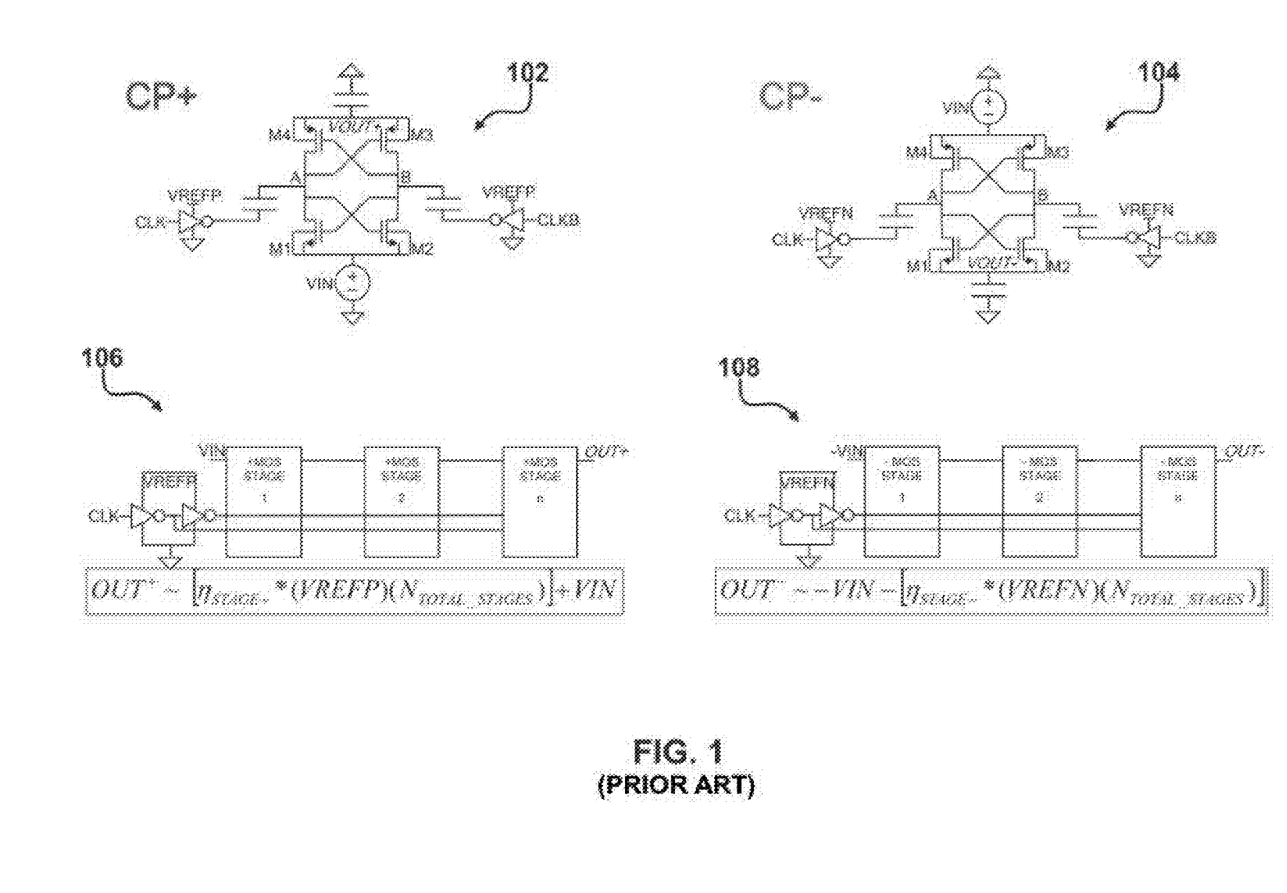
FIG. 1 shows a basic positive and negative charge pump design according to the prior art.

Prior art describes the use of individual charge pump cells to create positive and negative charge pumps as illustrated in FIG. 1. Specifically, FIG. 1 shows schematic representations of a positive charge pump cell 102 and a negative charge pump cell 104. In some embodiments, the charge pump cells can be cascaded to form a larger charge pump to provide a larger DC output voltage thus increasing the DC output voltage. FIG. 1 further shows a multi-stage positive charge pump 106 and a multi-stage negative charge pump 108. The output voltage of the multi-stage positive charge pump 106 can be determined based on the equation: $OUT^+ = [\eta_{STAGE+} *(VREFP)(N_{TOTAL\_STAGES})] + VIN$, where our is the positive output voltage, VIN is the input voltage, VREFP is a reference voltage, $N_{TOTAL\_STAGES}$ is the total number of charge pump stages and $\eta_{STAGE+}$ is the efficiency of the positive charge pump. Similarly, the output voltage of the multi-stage negative charge pump 108 can be determined based on the equation: $OUT^- = -VIN - [\eta_{STAGE-}*(VREFN)(N_{TOTAL\_STAGES})]$, where OUT is the negative input voltage and $\eta_{STAGE-}$ is the efficiency of the negative charge pump.

Figure 2:
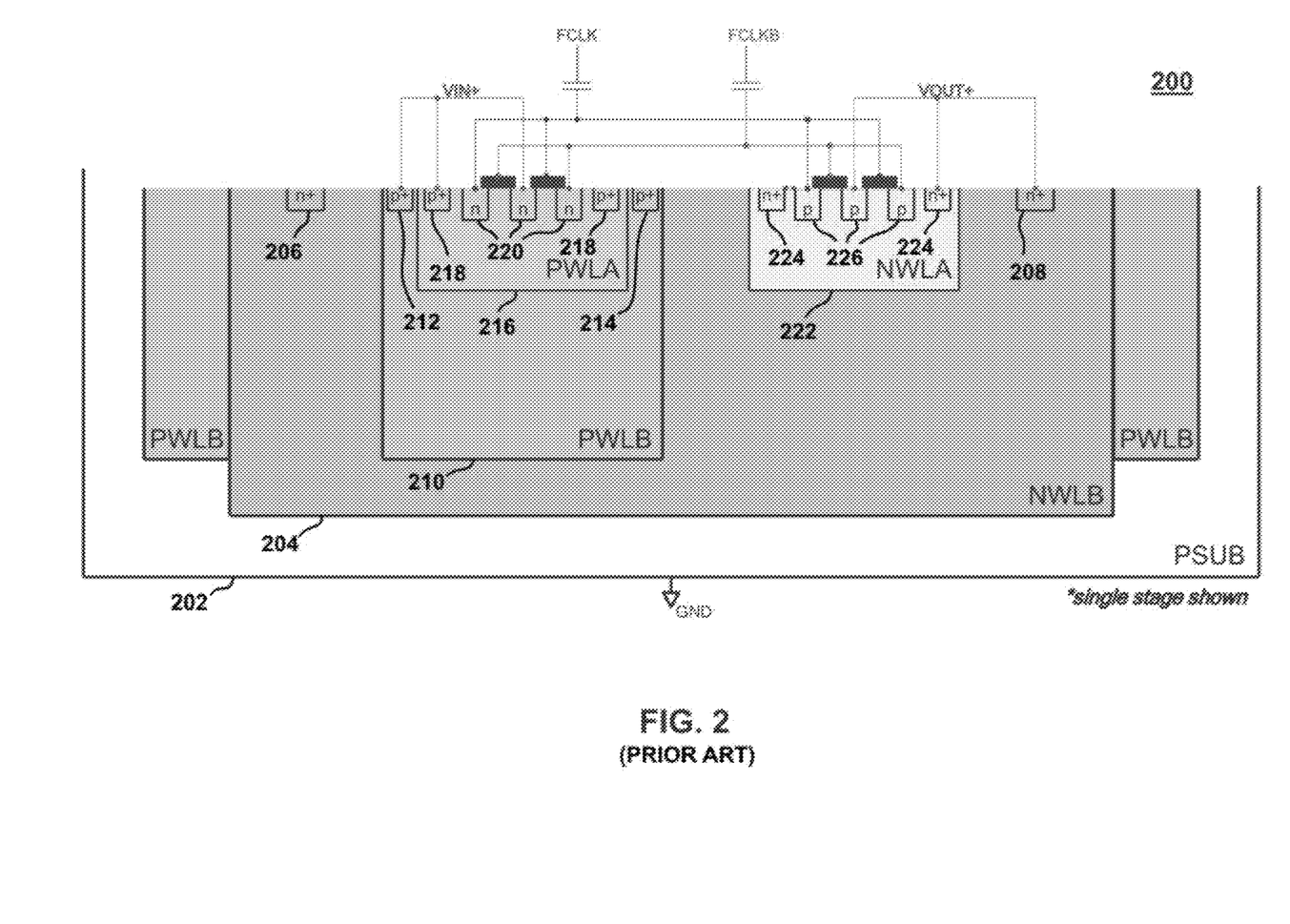
FIG. 2 shows a cross-sectional view of an exemplary semiconductor layout for a positive charge pump cell according to the prior art.
Figure 3:
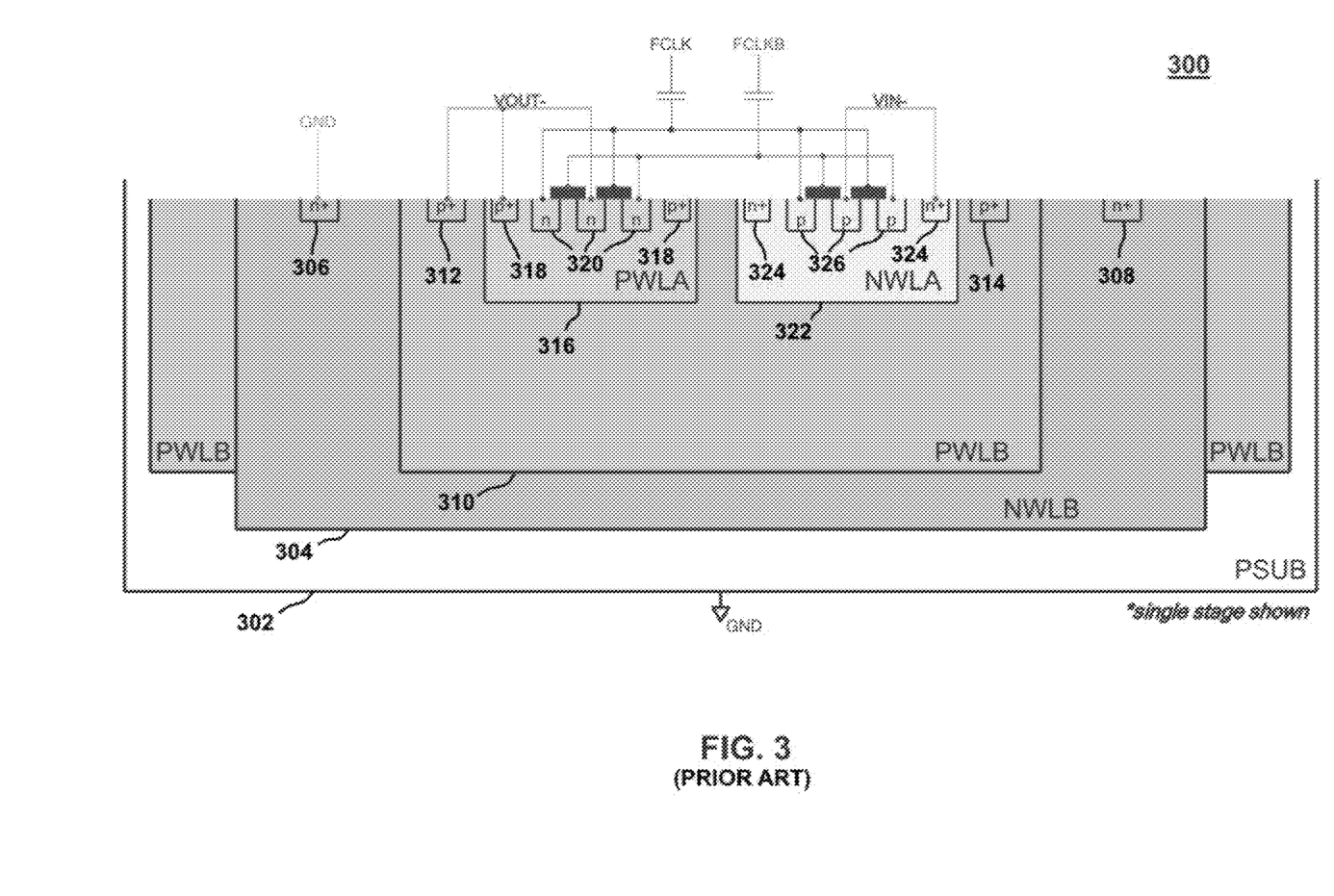
FIG. 3 shows a cross-sectional view of an exemplary semiconductor layout for a negative charge pump cell according to the prior art.

FIGS. 2 and 3 show differences in the most basic layouts for a positive charge pump cell (FIG. 2) and a negative charge pump cell (FIG. 3). The positive charge pump cell of FIG. 2 includes a p-type substrate 202. An n-type well 204 is formed within the p-type substrate 202 and includes two n+ doped regions 206 and 208. The n-well 204 is connected to VOUT+ through the n+ doped regions 206 and 208. An optional second n-well region 222 can be placed in the n-type well 204. Within the n-well regions 204 or 222, p-type metal-oxide-semiconductor (PMOS) transistors are formed by the p-type region 226. The gates and drains of the PMOS transistors are connected to nodes A and B according to the charge pump cell 102 while the sources and bulks of the PMOS transistors are connected to VOUT+. A p-type well 210 is formed in the n-type well 204 and includes two p+ regions 212 and 214. The p-well 210 is connected to VIN+. An optional second p-well region 216 can be placed in the p-type well 210. Within the p-well regions 210 or 216, n-type metal-oxide-semiconductor (NMOS) transistors are formed by the n-type regions 220. The gates and drains of the NMOS transistors are connected to nodes A and B according to the charge pump cell 102 while the sources and bulks of the NMOS transistors are connected to VIN+.

The negative charge pump cell of FIG. 3 includes a p-type substrate 302. An n-type well 304 is formed within the p-type substrate 302 and includes two n+ doped regions 306 and 308. The n-well 304 is connected to GND through the n+ doped regions 306 and 308. A p-type region 310 is formed within the n-well 304. The p-type region 310 is connected to VOUT− through the p+ doped region 312. A second n-well region 322 is formed within the p-type region 310. Within the n-well region 322, PMOS transistors are formed by the p-type region 326. The gates and drains of the PMOS transistors are connected to nodes A and B according to the charge pump cell 104 while the sources of the PMOS transistors are connected to VIN−. An optional second p-well region 316 can be placed in the p-type well 310. Within the p-well regions 310 or 316 NMOS transistors are formed by the n-type regions 320. The gates and drains of the NMOS transistors are connected to nodes A and B according to the charge pump cell 104 while the sources of the NMOS transistors are connected to VOUT−.

As noted above, the differences in layouts of the previously known positive and negative charge pumps can produce leakage paths or other loss mechanisms in each pump that can increase the separation between the efficiency of the positive and negative CPs. The efficiency difference can in turn make the voltage difference between the two charge pumps larger. Improvements to charge pumps in MEMS microphones to reduce or eliminate differences in the DC output magnitude from CPs would be beneficial.

BRIEF DESCRIPTION OF THE DRAWINGS

The foregoing aspects and other features of are explained in the following description, taken in connection with the accompanying drawings.

DETAILED DESCRIPTION

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

Figure 4:
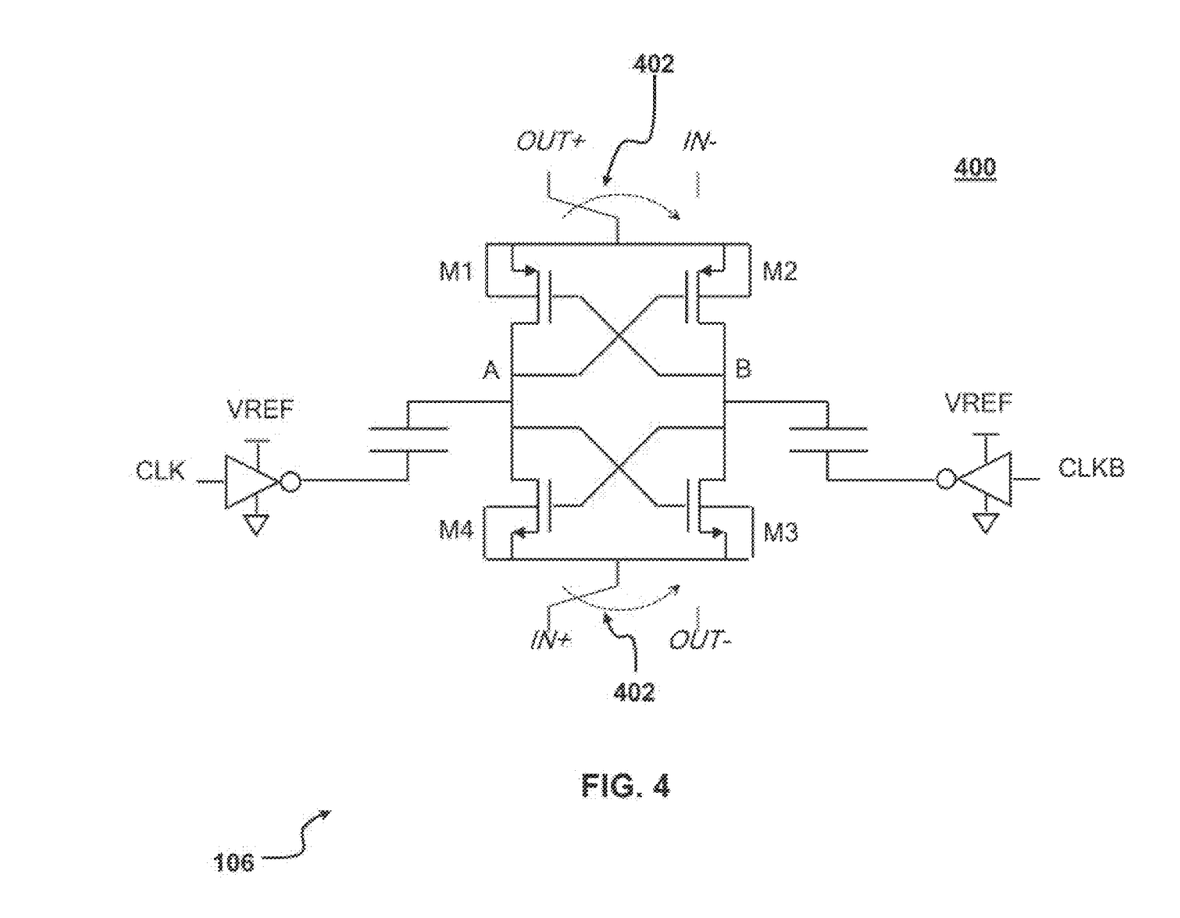
FIG. 4 shows a schematic representation of a bi-directional charge pump cell according to the present disclosure.

As discussed below, the charge pump cells according to this disclosure have the same designs/layouts. This enables the polarity of the charge pump cells to be easily switched. Therefore, in contrast to the positive and negative charge pump cells 102, 104 of FIG. 1, the BDCP cell 400 includes switches 402 configured to switch the directionality of the input and output of the BDCP cell 400. Particularly, each of the switches 402 can be selectively connected to either an input IN+ or and output OUT−. In this way, a single bi-directional charge pump (BDCP) cell design can be used for both + and − charge pumps. Additionally, this removes layout/processing of CP+ and CP− cells as variables in future measurements. If needed, the BDCP can be permanently set to positive or negative via metal spin, or programmed to switch between voltages.

Figure 5:
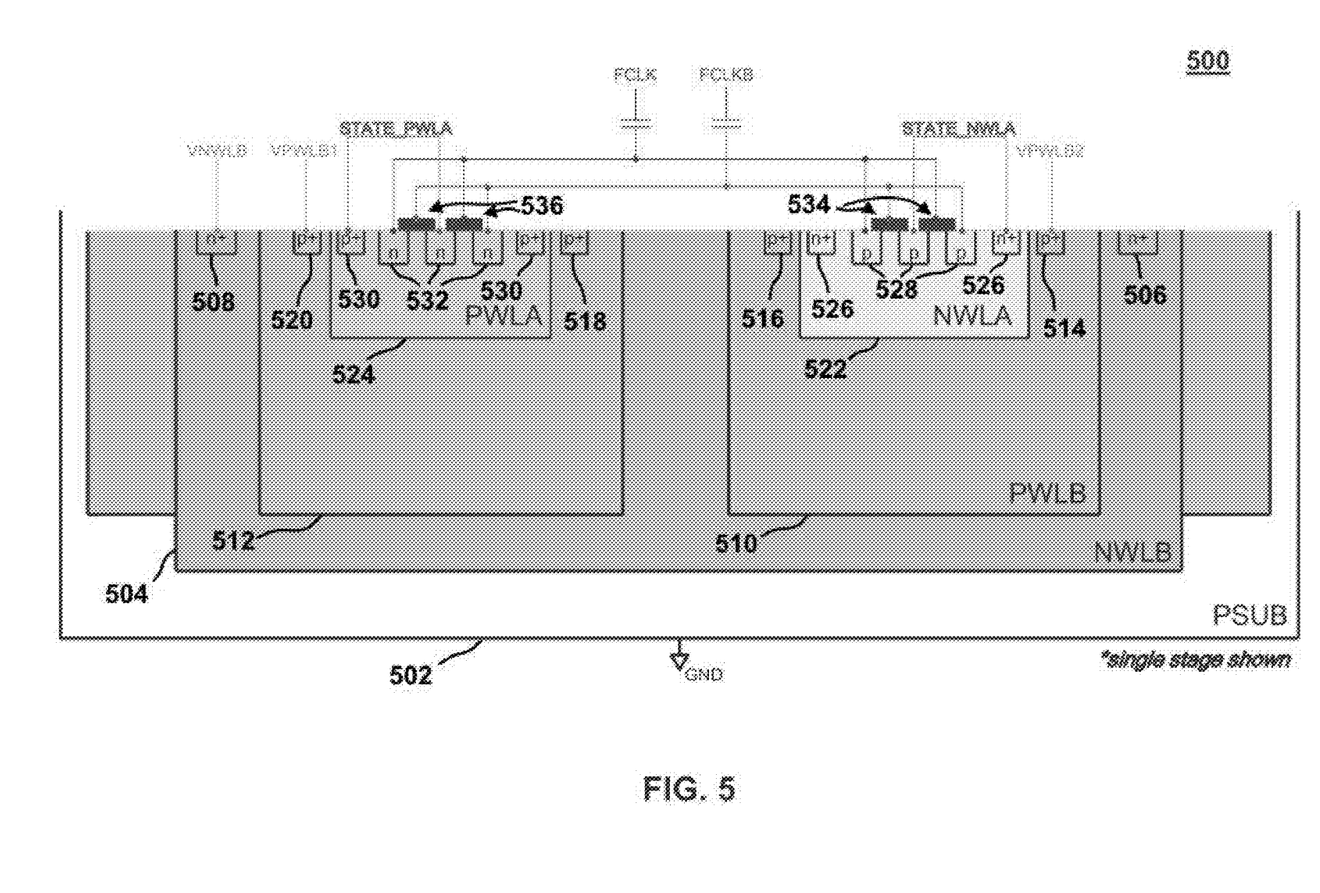
FIG. 5 shows a cross-sectional view of a semiconductor layout for a bi-directional charge pump cell according to the present disclosure.

FIG. 4 shows a schematic representation of a bi-directional charge pump (BDCP) cell 400, also referred to as a MOS charge pump stage. With the switches 402 configured to connect M1 and M2 to OUT+ and M3 and M4 to IN+, the charge pump operates as a positive charge pump cell. In this operational mode, after a rising edge on a CLK signal, transistors M1 and M3 are switched off while transistors M2 and M4 are switched on. Transistor M4 allows the capacitor on Node A to be charged to an input voltage (IN+) while transistor M1 isolates an output voltage (OUT+) from Node A. Conversely, transistor M3 isolates the stored charge on Node B from IN+ and since charge is conserved when CLK transitions from low to high, the voltage on Node B is increased by the clock voltage VREF and is transferred to OUT+ through M2. A complementary operation occurs on the rising edge of the CLKB signal with M2 and M4 switched off and M1 and M3 switched on. If the switches 402 are configured to connect M1 and M2 to IN− and M3 and M4 to OUT−, the charge pump operates as a negative charge pump cell. The operation follows as described for the positive charge pump however due to the input IN− being connected to M1 and M2 the charge pump output becomes negative, FIG. 5 shows a cross-sectional view of a semiconductor layout 500 for a bi-directional charge pump cell, such as the bi-directional charge pump cell 400 of FIG. 4, that can be used to implement both positive charge pump cells and negative charge pump cells with the appropriate electrical connections. This layout is designed to tolerate high voltages of either polarity; furthermore, the high symmetry of the structure ensures that the pump's efficiency in one configuration is well-matched to the other.

The semiconductor layout 500 includes a p-type substrate 502. An n-type well 504 is formed within the p-type substrate 502 and includes two n+ doped regions 506 and 508. The n-well 504 is connected to VNWLB through the n+ doped regions 506 and 508. A p-type region 510 is formed within the n-well 504. The p-type region 510 is connected to VPWLB2 through the p+ region 514 and 516. An n-well region 522 is formed within the p-type region 510. Within the n-well region 522 PMOS transistors are formed by the p-type region 528. The gates and drains of the PMOS transistors are connected to nodes A and B according to the charge pump cell 400 while the sources and bulks of the PMOS transistors are connected to STATE_NWLA. A second p-well region 512 is formed within the n-well region 504. An optional second p-well region 524 can be placed in the p-type well 512. The p-well region 512 is connected to VPWLB1 through the p+ regions 518 and 520. Within the p-well regions 512 or 524, NMOS transistors are formed by the n-type regions 532. The gates and drains of the NMOS transistors are connected to nodes A and B according to the charge pump cell 400 while the sources and bulks of the NMOS transistors are connected to STATE_PWLA.

Figure 6:
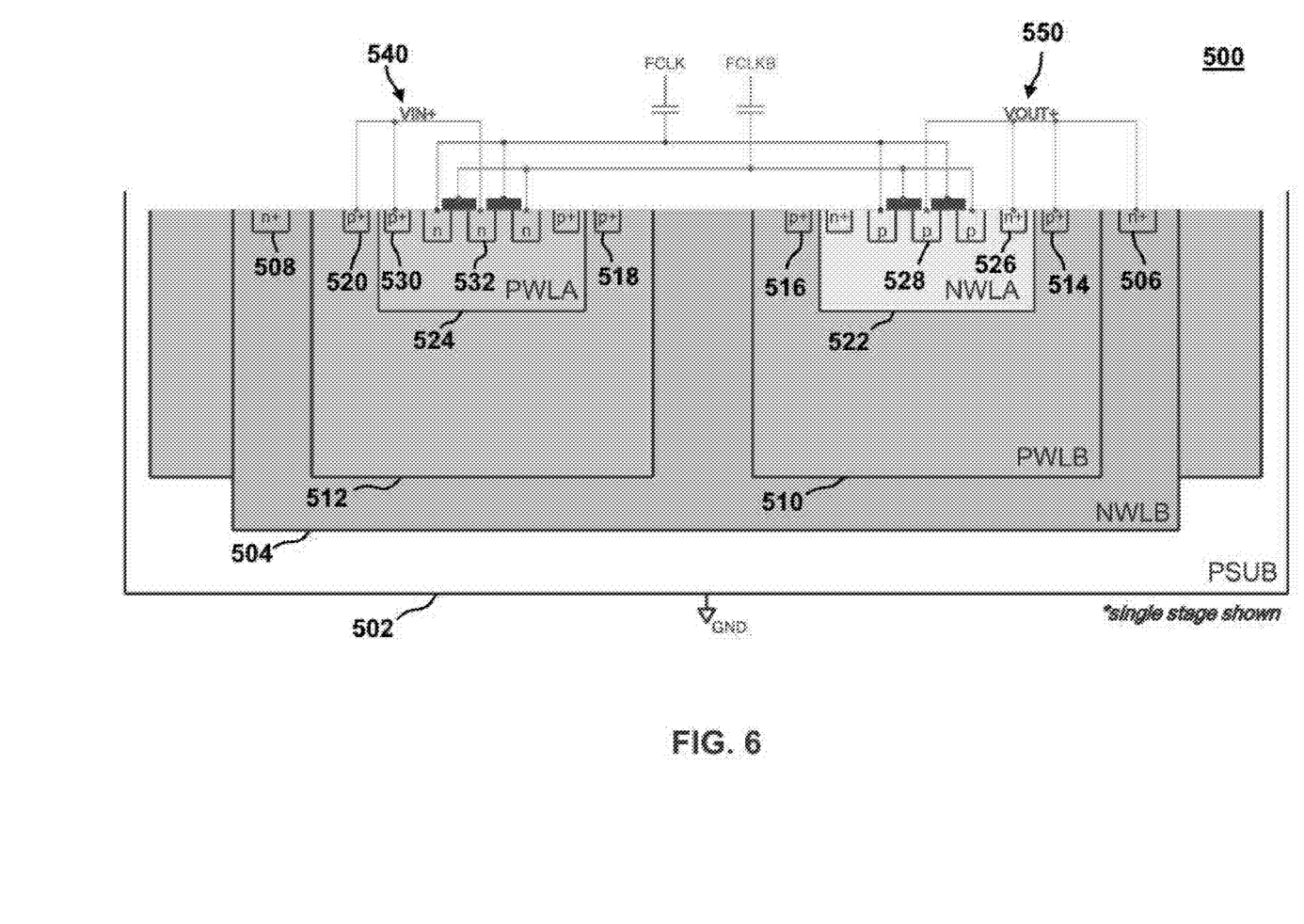
FIG. 6 shows a cross-sectional view of the bi-directional charge pump cell of FIG. 5 in a positive charge pump configuration.

The charge pump layout 500 of FIG. 5 can be configured as both a positive charge pump cell, as depicted in FIG. 6, and a negative charge pump cell, as depicted in FIG. 7, when appropriate electrical connections for VIN and VOUT are implemented. To connect the charge pump cell 500 in a positive configuration as depicted in FIG. 6, VIN+ 540 is connected to one of the p+ regions 520 in second p-type well 512, one of the p+ regions 530 in p-well 524 and to the sources of the NMOS transistors in p-well 520 or 524. A connection 550 for VOUT+ is provided by tying together one of the n+ doped regions 506 or 508 in the n-well 504, one of the p+ doped regions 514 in second-type p-well 510, one of the n+ doped regions 526 in n-well 522 and the sources of the PMOS transistors in n-well 522.

Figure 7:
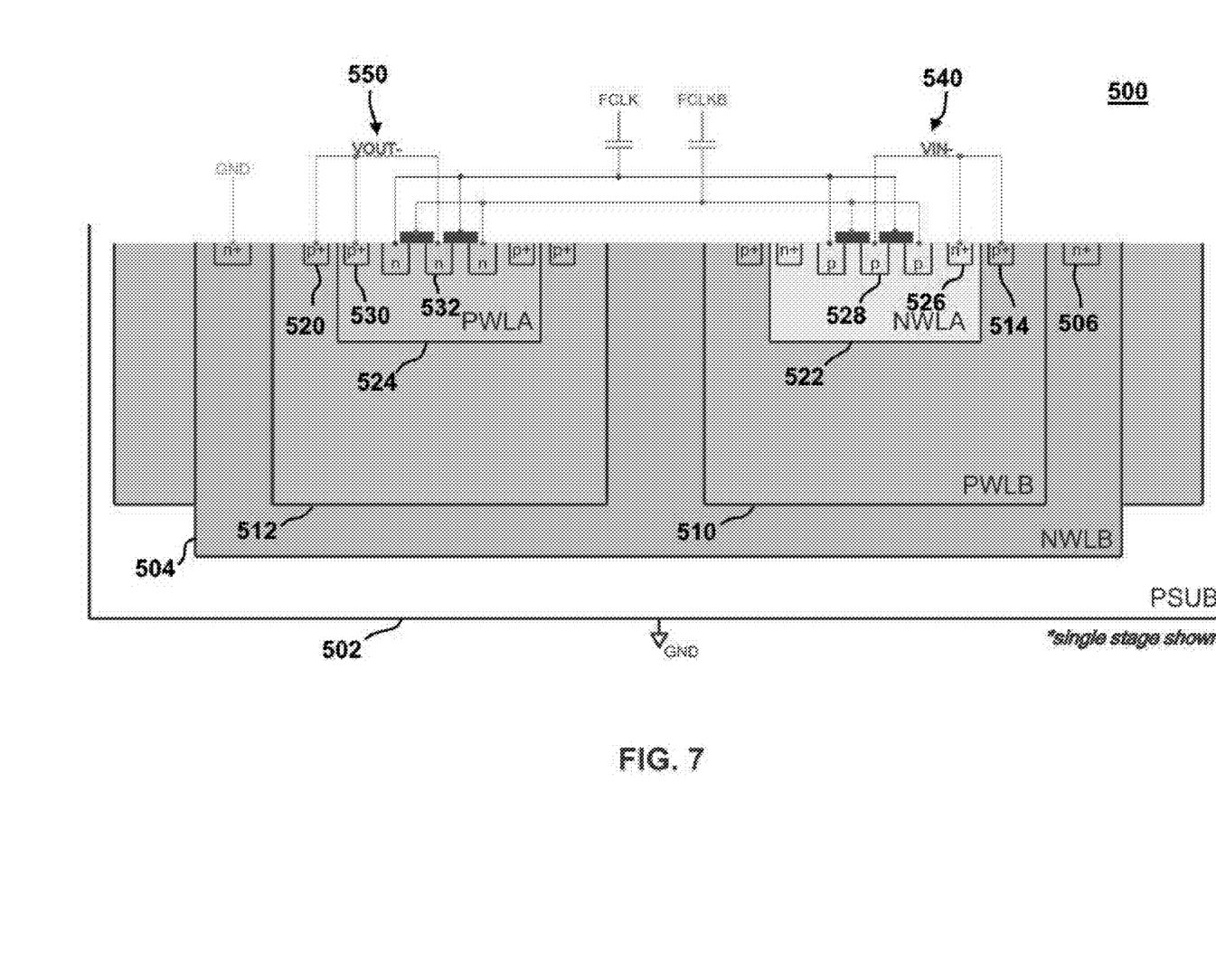
FIG. 7 shows a cross-sectional view of the bi-directional charge pump cell of FIG. 5 in a negative charge pump configuration.

To connect the charge pump cell 500 in a negative configuration as depicted in FIG. 7, VIN− 540 is connected to the n+ doped region 526 within the n-well region 522, the p+ region 514 within the second-type p-well 510 and the sources of the PMOS transistors in n-well 522. A connection 550 for VOUT− is provided by tying together the p+ region 530 in the p-well 524, the p+ region 520 within the second-type p-well 512 and the sources of the NMOS transistors within the p-well regions 520 or 524. The second-type n-well 504 is connected to GND or a higher DC voltage.

Figure 8:
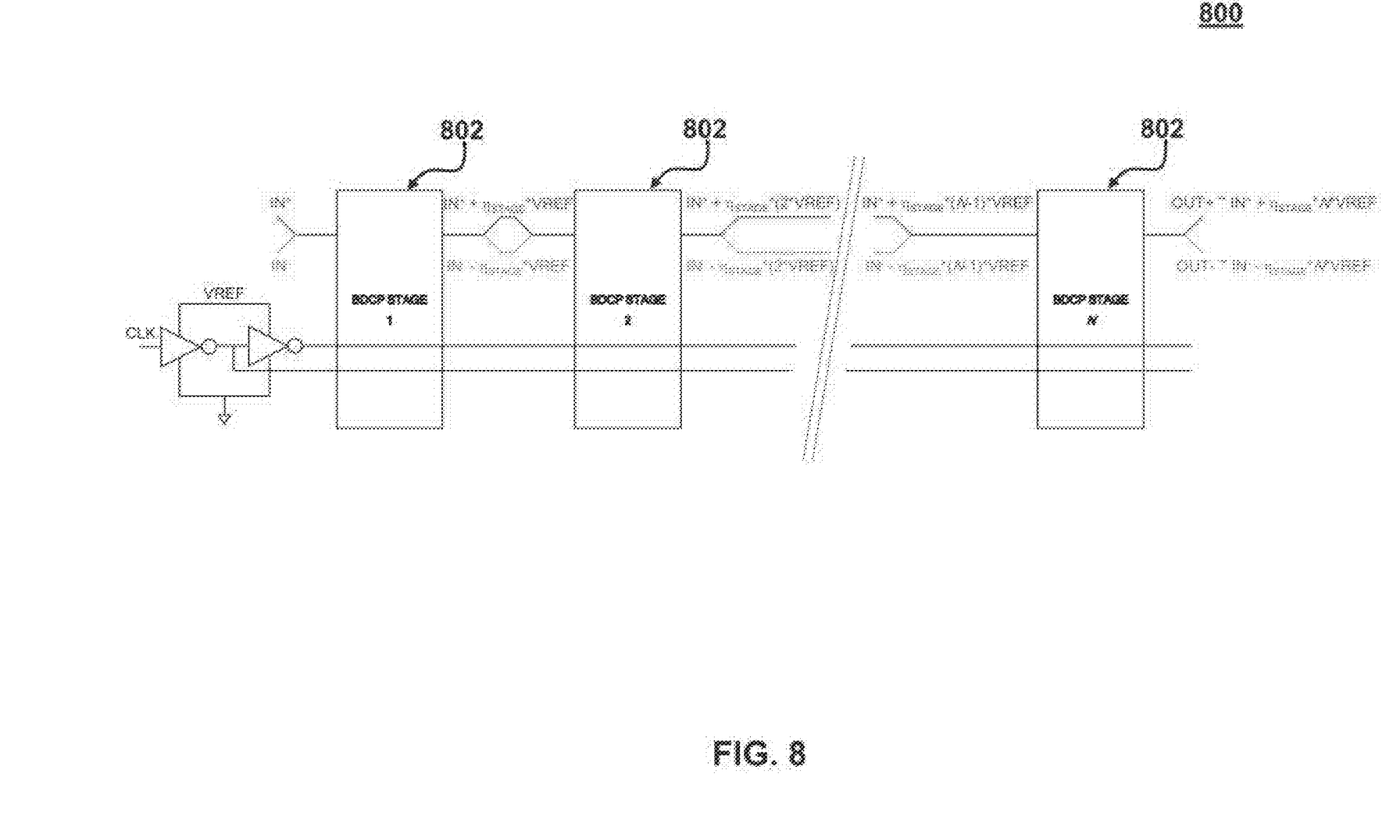
FIG. 8 shows a multi-stage bi-directional charge pump utilizing bi-directional charge pump cells such as depicted in FIGS. 5-7.

FIG. 8 shows a multi-stage bi-directional charge pump 800 that includes a plurality of BDCP stages 802 in a cascaded configuration. The BDCP stages 802 are formed by charge pump cells, such as depicted in FIGS. 5-7. As can be seen in the inputs and outputs of the stages can be tied together so that the polarity of the charge pump stages can be switched between positive and negative. The charge pump can be configured for several unique microphone applications, discussed below.

Figure 9:
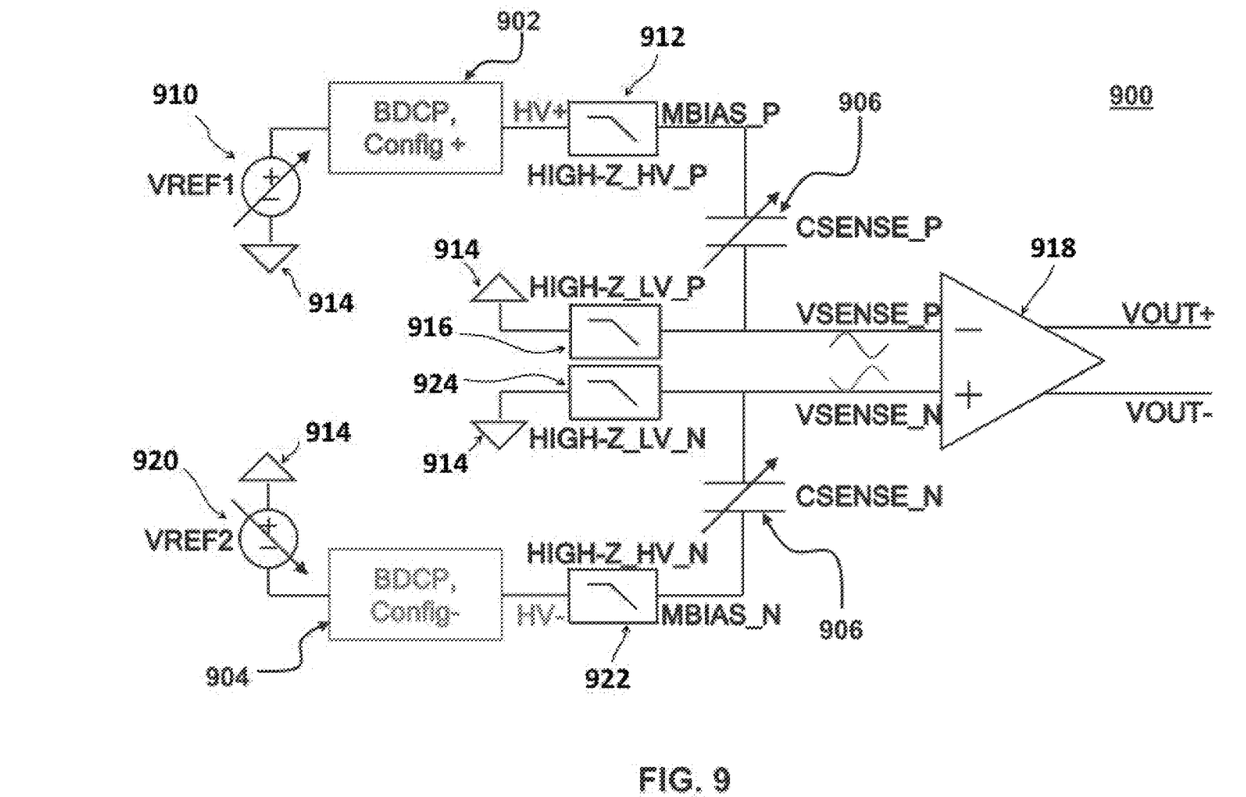
FIG. 9 shows a schematic representation of an electrically differential bias circuit utilizing bi-directional charge pump cells such as depicted in FIGS. 5-7.

FIG. 9 shows a schematic representation of an electrically differential bias circuit 900 that utilizes bi-directional charge pumps described in reference to FIGS. 4-7. The bias circuit 900 is configured to drive an electrically differential microphone. In operation, a first voltage source 910 generates an input voltage (VREF1). Please note, the input reference voltage to the positive and negative charge pumps can be either positive, negative, or ground for both pumps. Typically, 0V is set to ground so that after pumping both remain equivalent, but it is possible (although not efficient) to start a negative pump with a positive input voltage or a positive pump with a negative input voltage. The positive charge pump 902 receives the input voltage and generates a bias voltage HV+ for the positive sense-capacitor 906 based on the positive input voltage. A high-impedance device 912 is coupled between the positive charge pump 902 and the positive sense-capacitor 906. As used herein, a high-impedance device can include one or more electronic components designed to increase impedance between a voltage source and a mechanical or electronic component (e.g., the positive sense-capacitor 906). The positive sense-capacitor 906 is coupled to a reference node 914 via a high-impedance device 916. The positive sense-capacitor 906 is also coupled to a first terminal of a differential amplifier 918. In some embodiments, the positive input voltage is equal to a voltage of the reference node 914. In some embodiments, the reference node 914 is a ground node (e.g., earth ground).

A second voltage source 920 generates an input voltage (VREF2). The negative charge pump 904 receives the input voltage and generates a negative bias voltage (HV−) for the negative sense-capacitor 906. A high-impedance device 922 is coupled between the negative charge pump 904 and the negative sense-capacitor 906. The negative sense-capacitor 906 is coupled to the reference node 914 via a high-impedance device 924. The negative sense-capacitor 906 is also coupled to a second terminal of the differential amplifier 918. In some embodiments, the negative input voltage is equal to the voltage of the reference node 914.

During a power-on-reset phase, the positive bias voltage is applied to the positive sense-capacitor 906. At the same time, the negative bias voltage is applied to the negative sense-capacitor 906. After the power-on-reset phase, incident positive sound pressure causes capacitances across both the positive and negative sense-capacitors to increase in value. A positive sense voltage (VSENSE_P), applied to the first terminal of the differential amplifier 918, increases with respect to the reference node 914 due to the increase in capacitance and positive charge across the positive sense-capacitor 906. Similarly, a negative sense voltage (VSENSE_N), applied to the second terminal of the differential amplifier 918, increases with respect to the reference node 914 due to the increase in capacitance and the negative charge across negative sense-capacitor 906.

The use of positive and negative charge pumps having the same design/layout enables the charge pumps 902, 904 to generate identical bias voltages of opposite polarity (i.e. VBIAS+, VBIAS−). Any acoustic/electrical input to the microphone is thus passed on to the front-end electronics as a fully-differential signal, which boosts several important specifications of the microphone (SNR, THD, etc).

Figure 10:
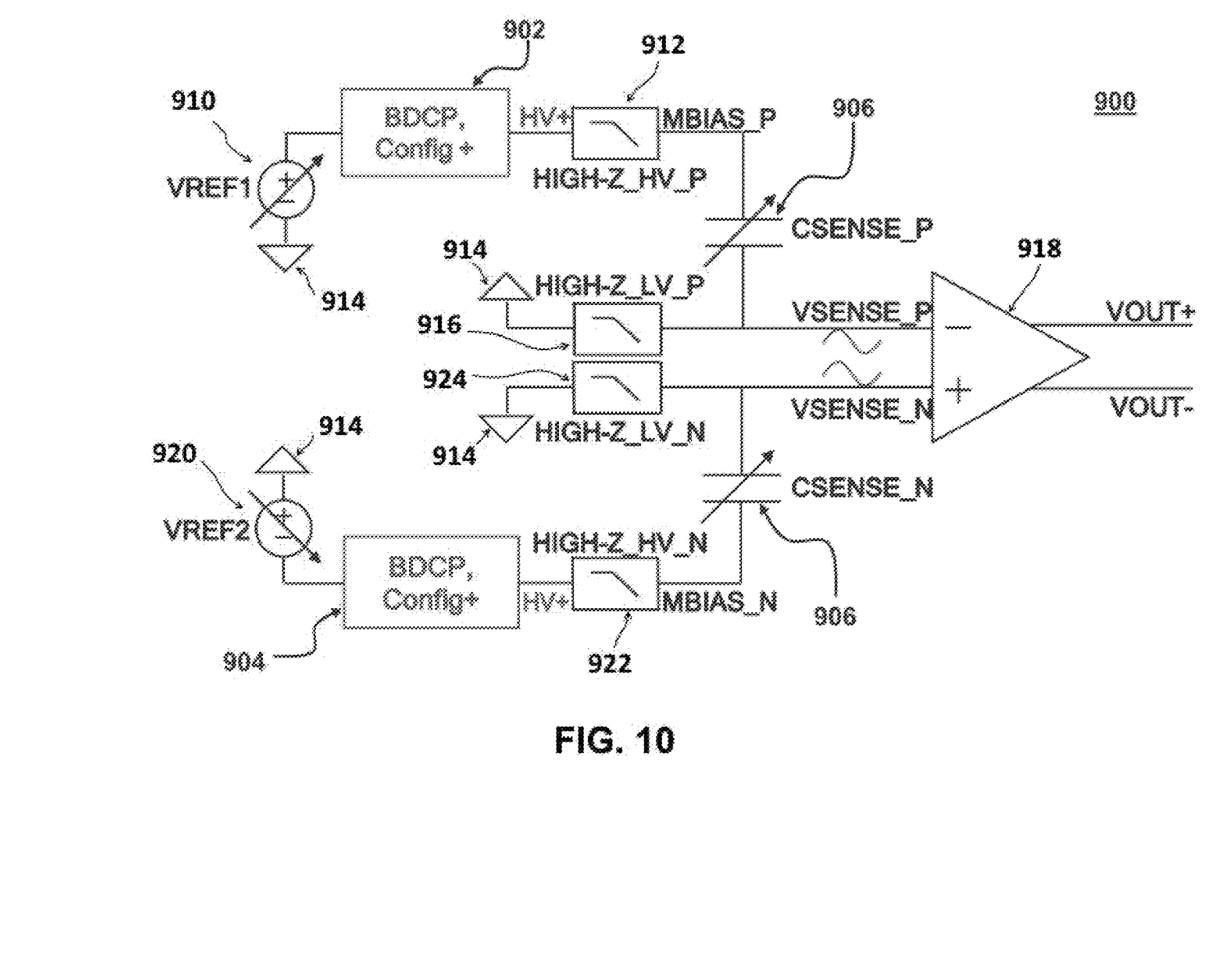
FIG. 10 shows a schematic representation of a common mode bias circuit utilizing bi-directional charge pump cells such as depicted in FIGS. 5-7.

FIG. 10 shows a schematic representation of a common mode bias circuit. The bias circuit of FIG. 10 is similar to the bias circuit of FIG. 9 except that the polarity of one of the BDCPs 902, 904 is switched such that both pumps now provide identical voltages of the same polarity. In this embodiment, the microphone elements 906 are therefore operated in an electrical common mode. Under this scheme, acoustic and external electronic stimuli are seen as common to both microphone elements 906 and rejected by the front-end circuitry, making this mode a useful tool for characterizing noise as well as electrical/acoustic rejection.

Figure 11A:
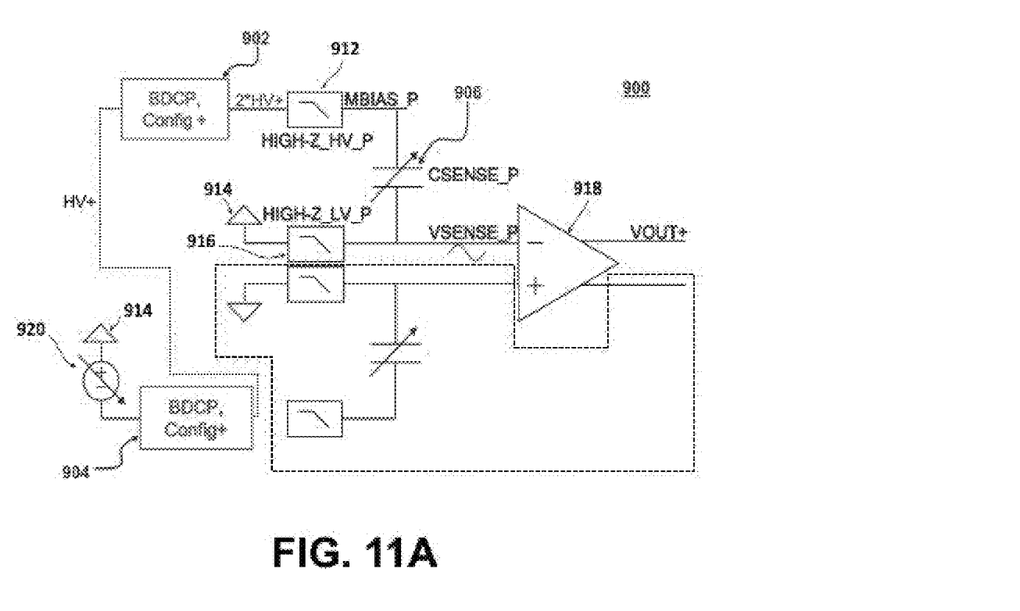
FIGS. 11A and 11B show schematic representations of voltage doubling bias circuits utilizing bi-directional charge pump cells such as depicted in FIGS. 5-7.
Figure 11B:
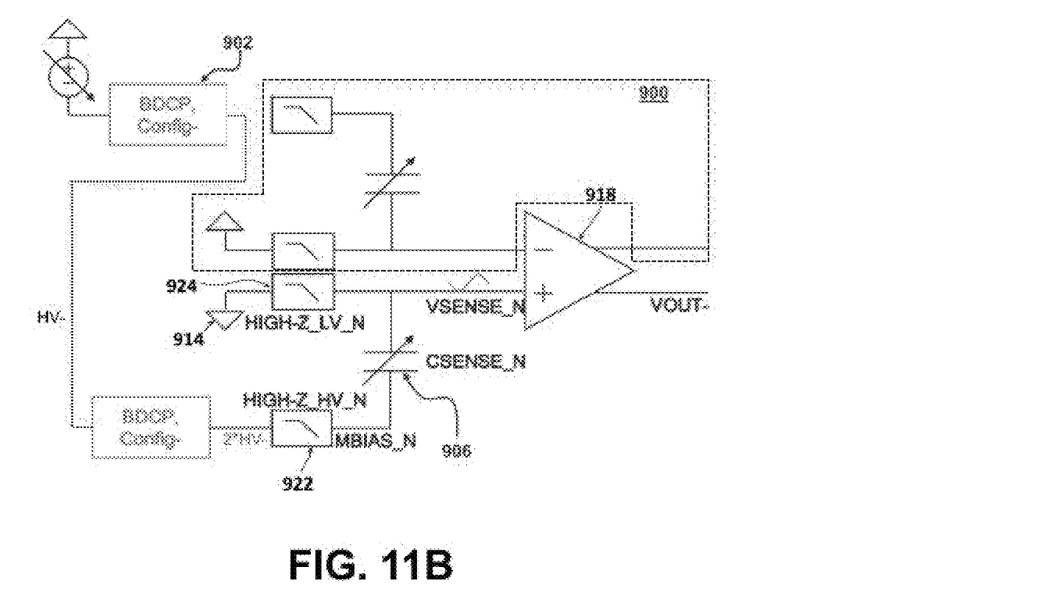

FIGS. 11A and 11B show schematic representations of using the BDCPs in the same configuration to double the magnitude of the maximum voltage of either charge pump with respect to ground. In FIG. 11A, both charge pumps 902, 904 are switched to a positive charge pump configuration and cascaded in series which doubles the bias voltage (2*HV+). Cascading the charge pumps in this manner results in the components previously associated with the negative charge pump being effectively removed from the circuit (as indicated by the dashed line box). In FIG. 11B, both charge pumps 902, 904 are switched to a negative charge pump configuration and cascaded in series which doubles the bias voltage (2*HV−). The components previously associated with the positive charge pump are effectively removed from the circuit. Higher bias voltages allow for a larger acoustic sensitivity and SNR, which can be exploited to mitigate some of the performance degradation caused by single-ended microphone operation.

Figure 12:
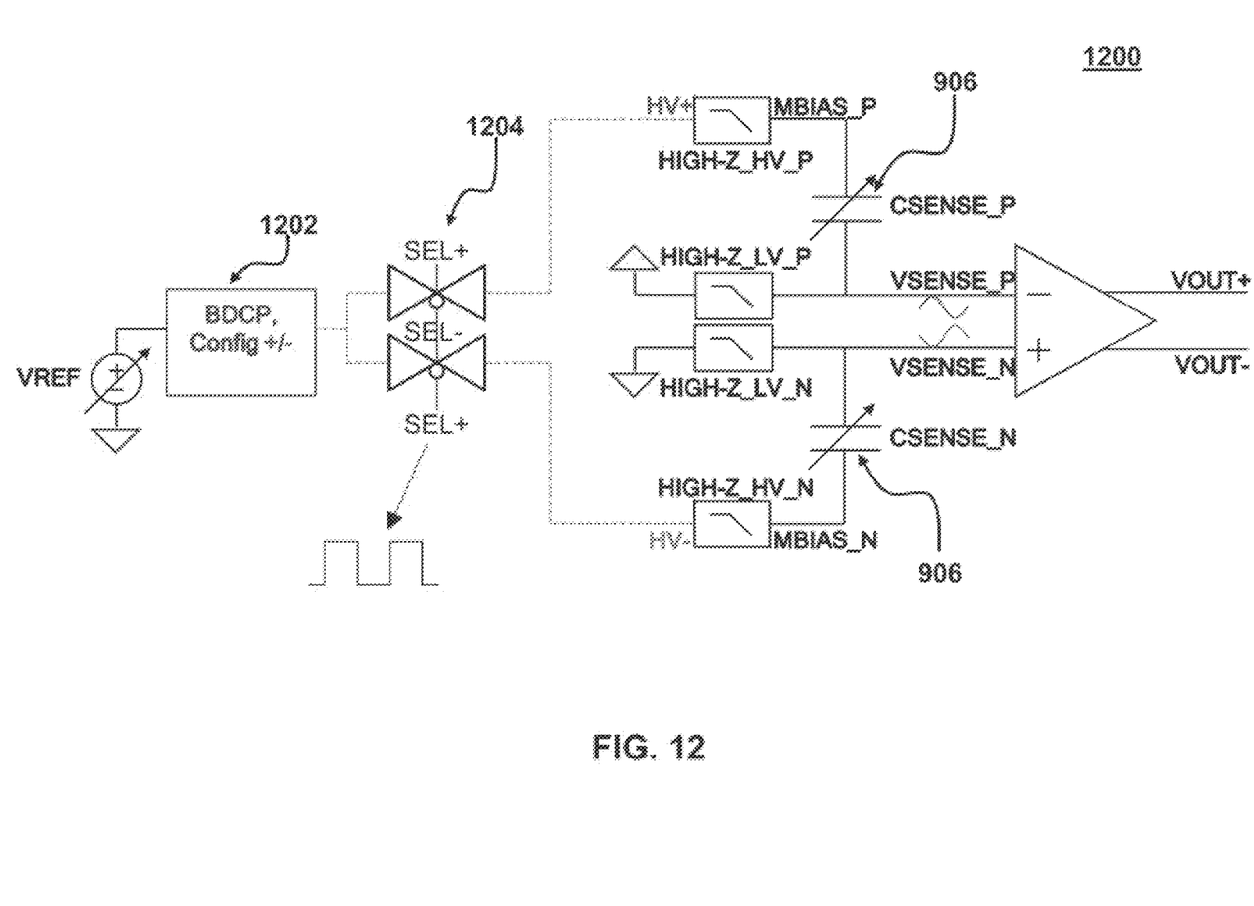
FIG. 12 shows a schematic representation of a voltage switching bias circuit utilizing bi-directional charge pump cells such as depicted in FIGS. 5-7.

FIG. 12 shows a schematic representation of a voltage switching bias circuit 1200. If desired, a single BDCP 1202 can be continuously switched to provide positive and negative bias voltages to each of the electrically differential microphones. In this configuration, a switch 1204 is connected between the BDCP 1202 and the bias terminal of one the microphone elements 906. Once this microphone element 906 is charged, the switch 1204 is disconnected from its bias terminal, and the polarity of the BDCP 1202 is switched. The BDCP 1202 then connects to the other microphone element 906, which receives a biasing current to produce a voltage of equal magnitude and opposite polarity compared to the first microphone element 906. Once the second microphone element 906 is charged, the BDCP 1202 is then disconnected, flipped in polarity, and connected back to the first microphone element 906. This procedure continues to repeat as necessary, and offers the benefit of savings in both power and area since only one BDCP 1202 is needed. Further optimization of the switching timing can be done as well to determine if the BDCP 1202 can be turned off at any point, which can provide additional power savings.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A bi-directional charge pump cell comprising:
   a p-type substrate having a main surface;
   a first n-well formed in the p-type substrate, the first n− well including n+ doped regions formed in the first n− well at the main surface;
   a first p-well formed in the first n− well, the first p− well including p+ doped regions formed in the first p-well at the main surface;
   a second n-well formed in the first p-well, the second n-well including n+ doped regions and p regions formed at the main surface, the p regions forming p-type metal-oxide semiconductor (PMOS) transistors;
   a second p-well formed in the first n-well, the second p-well including p+ doped regions formed in the second p-well at the main surface; and
   a third p-well defined in the second p-well, the third p-well including p+ doped regions and n regions at the main surface, the n regions forming n-type metal-oxide semiconductor (NMOS) transistors.

2. The bi-directional charge pump cell of claim 1, further comprising gate electrodes formed on the main surface over the second n-well and over the third p-well.

3. The bi-directional charge pump cell of claim 1, further comprising:
   a first voltage connection and a second voltage connection;

a first switch configured to switch the first voltage connection between a positive voltage out position and a negative voltage in position; and a second switch configured to switch the second voltage connection between a positive voltage in position and a negative voltage out position.

4. The bi-directional charge pump cell of claim 1, further comprising:

a first voltage connection and a second voltage connection, wherein the first voltage connection is permanently connected in one of a positive voltage out position and a negative voltage in position, wherein the second voltage connection is permanently connected in a positive voltage in position when the first voltage connection is in the positive voltage out position, and wherein the second voltage connection is permanently connected in a negative voltage out position when the first voltage connection is in the negative voltage in position.

5. An electrically differential bias circuit comprising:

a first bi-directional charge pump and a second bi-directional charge pump each including:
 a p-type substrate having a main surface;
 a first n-well formed in the p-type substrate, the first n– well including n+ doped regions formed in the first n– well at the main surface;
 a first p-well formed in the first n– well, the first p– well including p+ doped regions formed in the first p-well at the main surface;
 a second n-well formed in the first p-well, the second n-well including n+ doped regions and p regions formed at the main surface, the p regions forming PMOS transistors;
 a second p-well formed in the first n-well, the second p-well including p+ doped regions formed in the second p-well at the main surface; and
 a third p-well defined in the second p-well, the third p-well including p+ doped regions and n regions at the main surface, the n regions forming NMOS transistors, wherein the first bi-directional charge pump is configured to output a first bias voltage in response to receiving a first input voltage, and wherein the second bi-directional charge pump is configured to output a second bias voltage in response to receiving a second input voltage.

6. The electrically differential bias circuit of claim 4, wherein the first bi-directional charge pump receives an input voltage and outputs a positive bias voltage, and wherein the second bi-directional charge pump receives an input voltage and outputs a negative bias voltage.

7. The electrically differential bias circuit of claim 4, wherein one of the first bi-directional charge pump and the second bi-direction charge pump receives earth ground.

8. The electrically common-mode bias circuit of claim 4, wherein the first bi-directional charge pump receives a first input voltage and outputs a first positive bias voltage, and wherein the second bi-directional charge pump receives a second input voltage and outputs a second positive bias voltage.

9. The electrically single-ended, voltage doubling bias circuit of claim 4, wherein the first bi-directional charge pump and the second bi-directional charge pump are connected in series.

10. The electrically single-ended, voltage doubling bias circuit of claim 7, wherein the first bi-directional charge pump receives an input voltage of a first polarity and outputs the first bias voltage with the first polarity, and wherein the second bi-directional charge pump receives the first bias voltage of the first polarity from the first bi-directional charge pump and outputs the second bias voltage with the first polarity, the second bias voltage having a voltage level that is double that of the input voltage.

11. An electrically differential bias circuit comprising:

a first bi-directional charge pump and a second bi-directional charge pump each including:
 a p-type substrate having a main surface;
 a first n-well formed in the p-type substrate, the first n– well including n+ doped regions formed in the first n– well at the main surface;
 a first p-well formed in the first n– well, the first p– well including p+ doped regions formed in the first p-well at the main surface;
 a second n-well formed in the first p-well, the second n-well including n+ doped regions and p regions formed at the main surface, the p regions forming PMOS transistors;
 a second p-well formed in the first n-well, the second p-well including p+ doped regions formed in the second p-well at the main surface; and
 a third p-well defined in the second p-well, the third p-well including p+ doped regions and n regions at the main surface, the n regions forming NMOS transistors;

a first voltage source that supplies a first input voltage to the first bi-directional charge pump, the first bi-directional charge pump being configured to supply a first bias voltage to an output of the first bi-directional charge pump in response to the first input voltage;

a second voltage source that supplies a second input voltage to the second bi-directional charge pump, the second bi-directional charge pump being configured to supply a second bias voltage to an output of the second bi-directional charge pump in response to the second input voltage;

a differential amplifier having a first input and a second input; and a first sense capacitor coupled between the output of the first bi-directional charge pump and the first input of the differential amplifier, and a second sense capacitor coupled between the output of the second bi-directional charge pump and the second input of the differential amplifier.

12. The electrically differential bias circuit of claim 9, wherein the first voltage source supplies an input voltage to the first bi-directional charge pump, the first bi-directional charge pump being configured to output a positive bias voltage in response to the positive input voltage, and wherein the second voltage source supplies an input voltage to the second bi-directional charge pump, the second bi-directional charge pump being configured to output a negative bias voltage in response to the negative input voltage.

13. The electrically common-mode bias circuit of claim 9, wherein the first voltage source supplies a first positive input voltage to the first bi-directional charge pump, the first bi-directional charge pump being configured to output a first positive bias voltage in response to the first positive input voltage, and wherein the second voltage source supplies a second positive input voltage to the second bi-directional charge pump, the second bi-directional charge pump being configured to output a second positive bias voltage in response to the second positive input voltage.

\* \* \* \* \*